United States Patent [19]
Thorne et al.

[11] Patent Number: 5,458,084
[45] Date of Patent: Oct. 17, 1995

[54] X-RAY WAVE DIFFRACTION OPTICS CONSTRUCTED BY ATOMIC LAYER EPITAXY

[75] Inventors: James M. Thorne, Provo; James K. Shurtleff, Sandy; David D. Allred; Raymond T. Perkins, both of Provo, all of Utah

[73] Assignee: Moxtek, Inc., Provo, Utah

[21] Appl. No.: 164,362

[22] Filed: Dec. 9, 1993

Related U.S. Application Data

[63] Continuation of Ser. No. 869,845, Apr. 16, 1992, abandoned.

[51] Int. Cl.$^6$ ................................................. C30B 25/16
[52] U.S. Cl. ............................ 117/89; 117/92; 117/93; 117/108; 117/953; 117/954; 378/36; 378/71; 378/84; 378/85
[58] Field of Search ................................. 378/36, 71, 84, 378/85, 145; 117/89, 92, 93, 102, 103, 105, 108, 953, 954

[56] References Cited

U.S. PATENT DOCUMENTS

| | | | |
|---|---|---|---|
| 3,980,883 | 9/1976 | Franks | 378/84 |
| 4,058,430 | 11/1977 | Suntola et al. | 156/611 |
| 4,261,771 | 4/1981 | Dingle et al. | 156/610 |
| 4,486,487 | 12/1984 | Skarp | 437/236 |
| 4,675,889 | 6/1986 | Wood et al. | 378/84 |
| 4,737,973 | 4/1988 | Ogawa et al. | 378/84 |
| 4,840,921 | 6/1989 | Matsumoto | 437/108 |
| 4,861,417 | 8/1989 | Mochizuki et al. | 156/611 |
| 4,870,648 | 9/1989 | Ceglio et al. | 378/145 |
| 4,904,337 | 2/1990 | Elliott et al. | 156/DIG. 72 |

*Primary Examiner*—Robert Kunemund
*Attorney, Agent, or Firm*—Thorpe North & Western

[57] ABSTRACT

X-ray wave diffraction devices are constructed using atomic layer epetaxy. A crystalline substrate is prepared with one or more surface areas on which multiple pairs of layers of material are to be deposited. These layers are then formed by atomic layer epetaxy on the surface areas of the substrate, one on top of another, with the material of each layer of each pair being selected to have a different index of refraction from that of the material of the other layer of each pair. The layers are formed so that the thickness of each layer of a pair is substantially the same as that of the corresponding layer of every other pair and so that x-ray waves impinging on the layers may be reflected therefrom. Layer pairs having a thickness of about 20 angstroms or less are formed on the substrate.

33 Claims, 8 Drawing Sheets

GOOD X-RAY REFLECTOR

POOR X-RAY REFLECTOR

Fig. 3

STEP #1

$A(g) \underset{\text{DESORPTION}}{\overset{\text{PHYSISORPTION}}{\rightleftarrows}} A(ad) \xrightarrow[\text{CHEMISORPTION}]{\text{SURFACE MIGRATION}}$

STEP #2

$A(ad) \xrightarrow{\text{DESORPTION}} A(g)$

STEP #3

$B(g) \underset{\text{DESORPTION}}{\overset{\text{PHYSISORPTION}}{\rightleftarrows}} B(ad)$ $A(s) + B(ad) \xrightarrow[\text{REACTION}]{\text{CHEMISORPTION}} C(s) + D(g)$ ● Zn  ⊜ Se  ⊘ Cd  ○ S

X-RAY WAVE DIFFRACTION OPTICS CONSTRUCTED BY ATOMIC LAYER EPITAXY

This application is a continuation of application Ser. No. 07/869,845, filed Apr. 16, 1992 now abandoned.

BACKGROUND OF THE INVENTION

This invention relates to optics for diffracting x-rays of short wavelength and a method of constructing such optics.

All materials have refractive indices very close to one (1.00) in the x-ray portion of the electromagnetic spectrum. As a result, optic structures and instruments for refraction and specular reflection of x-rays cannot be made from a single material. Some reflection of x-ray waves, however, does occur at the interface of two materials having different refractive indices. If such a pair of materials is formed into a large number of alternating layers, with the layered pairs having substantially the same thickness (or at least the corresponding layers of each pair having substantially the same thickness), the reflectances accumulate if the wavelength L and the angle of incidents i (measured from the plane of the reflective surface) meet the requirements of the Bragg equation: $nL=2d \sin i$, where n is the order of diffraction and is an integral number and d is the layer pair thickness. Such multilayer structures, constructed using conventional sputtering (the ejection of atoms or groups of atoms from a source onto another surface to form a thin layer thereof) or vacuum deposition (producing a surface film of metal on a heated surface, typically in a vacuum, either by decomposition of the vapor of a compound at the work surface, or by direct reaction between the work surface and the vapor, have been utilized for reflecting, focusing, dispersing, etc., electromagnetic waves.

However, with the currently used methods of producing the multilayer structures (sputtering and vacuum deposition), it is difficult to develop layers having a thickness of less than about twelve angstroms and so a certain range of x-ray wavelengths cannot be diffracted. At least, it is difficult, if not impossible, to develop layers having a uniform thickness of twelve angstroms or less. The reason for this is apparently because the materials used to construct the layers tend to clump together when physical vapor deposition methods are utilized. That is, the first few atoms deposited tend to aggregate on the surface to form islands several angstroms thick before they begin to grow laterally. When such clumps or islands finally grow together, their crystal orientations are unlikely to match so that a grain boundary is formed. Such imperfections not only themselves degrade x-ray reflection but they also serve as "chimneys" where one material diffuses into another and this, in turn, further degrades x-ray reflection because the refractive indices of the diffused materials are subsequently closer together.

In addition to the above problems with currently used physical deposition techniques for constructing multilayer devices, sputtering, and especially evaporation, oftentimes tend to blur the interface between layers by driving fast moving vapor of one layer into the adjacent layer of material. Furthermore, physical vapor deposition methods tend to be statistical in nature, i.e., atoms arrive at the surface on which they are being deposited at random times and in random places and usually "freeze" into the surface where they first touch. Physical deposition cannot be stopped at the precise time when enough atoms have been added to complete the last layer to thereby even out the variations in coverage of the layer. As a result, one or more of the top layers will be incomplete and this leads to rough interfaces between layers and variations in layer of thickness, both of which decrease reflectance of electromagnetic waves. Also, random fluctuations (in location and quantity) in arrival of the atoms lead to roughness at the interfaces.

Although the imperfections described above are not a serious problem in multilayer structures having thick layer pairs, they can be fatal to the usefulness of structures whose layers are thinner than about twenty angstroms. An illustration of this problem is shown in FIG. 1 of the drawings, where a good x-ray multilayer reflector, shown at 4, has layers of uniform thickness and smooth interfaces, and a poor x-ray reflector, shown at 8, has layers of nonuniform thickness and rough interfaces. Since very thin layers are needed for diffracting short x-ray wavelengths used, for example, in medicine and nondestructive testing, useful diffracting instruments in these fields cannot be constructed with currently available physical deposition techniques.

Crystals have also been used to diffract electromagnetic radiation, including x-rays, and they present diffracting planes which are more nearly perfect. However, crystals are also usually quite small, cannot be bent or shaped much without fracturing, and the range of layer of thicknesses available is limited (all are too small for soft x-rays). Multilayer structures, of course, if they could be constructed with layers whose interfaces are smooth and whose thicknesses are uniform, would provide a solution to these shortcomings since such structures can be specifically designed with (1) areas of a predetermined size (larger than many crystals), (2) layers having a predetermined thickness, and (3) reflecting surfaces which are shaped in a predetermined way, for example curved to focus reflected radiation. The areas of application for a high quality, controllable surface shape and thin multilayer structure are legion, including x-ray microlithography for the production of integrated circuits, and x-ray focusing optics for use in medical diagnostics, biological research, and nondestructive testing (for example, weld inspection, fatigue, cracks, etc., in metal or metal alloys).

SUMMARY OF THE INVENTION

It is an object of the invention to provide a multilayer structure for diffracting x-ray waves, and a method of constructing such structure.

It is a further object of the invention to provide such a structure whose layers are generally of uniform thickness and whose layer interfaces are smooth, abrupt and consistent.

It is also an object of the invention to provide such a structure whose layers may be constructed to a thickness of twelve angstroms or less.

It is a further object of the invention to provide a method for constructing optical elements capable of reflecting, focusing or dispersing incident x-rays.

It is an additional object of the invention to provide a method of fabricating x-ray optics whose parameters and characteristics can be carefully controlled.

The above and other objects of the invention are realized in a specific illustrative embodiment of x-ray wave diffraction structure constructed by atomic layer epitaxy. The structure includes a substrate having a surface area, and multiple pairs of layers of material, one on top of another, formed on the surface area by atomic layer epitaxy. The layers are formed of materials such that each layer of each pair has a different index of refraction from the other layer of the pair. Also, the layers are formed so that the thickness of each layer of a pair is substantially the same as the corresponding layer of every other pair.

In accordance with one aspect of the invention, the layer pairs are formed to have a thickness of about twelve angstroms or less so that short x-ray waves may be diffracted.

In accordance with another aspect of the invention, the layer pairs are formed out of materials having indices of refraction which are substantially different to thus achieve high reflectance.

In accordance with still another aspect of the invention, the layer pairs are formed out of materials having indices of refraction which are close in value to achieve high resolution of diffracted x-rays, i.e., reflect a narrow band of wavelengths and have low absorption of the waves.

BRIEF DESCRIPTION OF THE DRAWINGS

The above and other objects, features and advantages of the invention will become apparent from a consideration of the following detailed description presented in connection with the accompanying drawings in which:

FIG. 3 is a diagrammatic illustration of the chemical vapor deposition atomic layer epitaxy process, showing the various steps in the process;

DETAILED DESCRIPTION

In accordance with the present invention, multilayer x-ray wave diffraction structure capable of reflecting, focusing, dispersing or otherwise handling short x-ray wavelengths of from about one to twelve angstroms is constructed using atomic layer epitaxy (ALE). Using ALE, it is possible to deposit one and only one layer of atoms during a process cycle so that layer thicknesses may be carefully controlled and smooth layer interfaces, with atomic abruptness, achieved.

Figure 4:
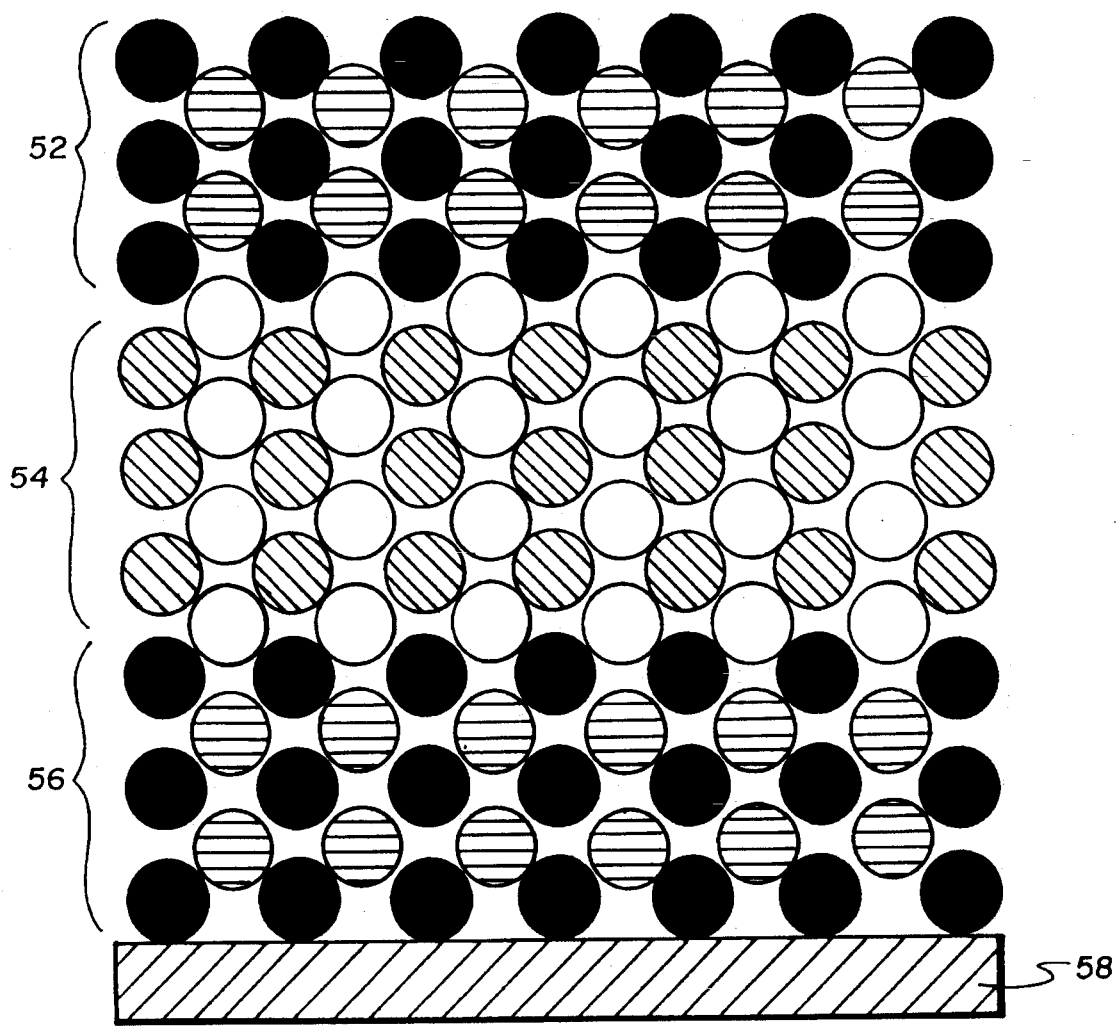
FIG. 4 is a diagrammatical side cross-sectional view of a multilayer device made in accordance with the principles of the present invention and showing alternate layers of ZnSe (2½ layers) and CdS (3½ layers)

ALE can be carried out by either of two processes, one known as molecular beam epitaxy and the other known as chemical vapor deposition ALE. As is known, the latter process is performed by passing a metal-organic vapor over a heated substrate, typically from about 300 to 450 degrees centigrade. In a matter of a second or two, a single layer (monolayer) of molecules or, in some cases, only the atoms to be included in the multilayer are chemically bound to the substrate. If the layer is a chemical compound, it can be considered to be composed of cations of the low electronegativity element and anions of the high electronegativity element. $Zn^{++}$ and $Cd^{++}$ are examples of cations; and Se— and S— are examples of anions. Referring ahead to FIG. 4 for a moment, a single monolayer of cations ($Zn^{++}$) is deposited on a substrate 58 first as a monolayer of metal-organic molecules from a vapor, and then it is converted to monolayer of metal by removing the excess vapor and replacing it with a reactive gas which removes the organic portion of the molecules. After the gaseous reaction products have been removed, a vapor of molecules bearing the anions is allowed to contact the newly deposited metal. (The anion vapor, in some instances, can be the reactive gas used for removing the organic portion of the cation molecules discussed above and thus a separate reactive gas would not be needed.) A monolayer of anions is deposited by this process. Depending on the vapor used, the same procedure described above involving an appropriate reactive gas could be utilized to leave only the monolayer of anions on the surface. The steps are summarized (without reactive gases) in the lefthand side of FIG. 2. Subsequent deposition of cations and anions is repeated by this process until the desired thickness is achieved. This constitutes one layer of the layer pair.

The second compound is deposited in the same way using appropriate vapors. Note that the second compound may have a different anion and a different cation than the first compound and the second layer of the pair will have a thickness different from the first. This whole process is repeated until the desired number of layer pairs has been deposited. With some types of vapors, only part of a monolayer is deposited during the first exposure. However, the fraction of the monolayer deposited always has a small integer as the denominator (e.g. ½, ¼, etc.) if the temperature and pressure are carefully selected. The monolayer can be completed by using the appropriate number of vapor exposure and reactive gas cycles.

Figure 1:
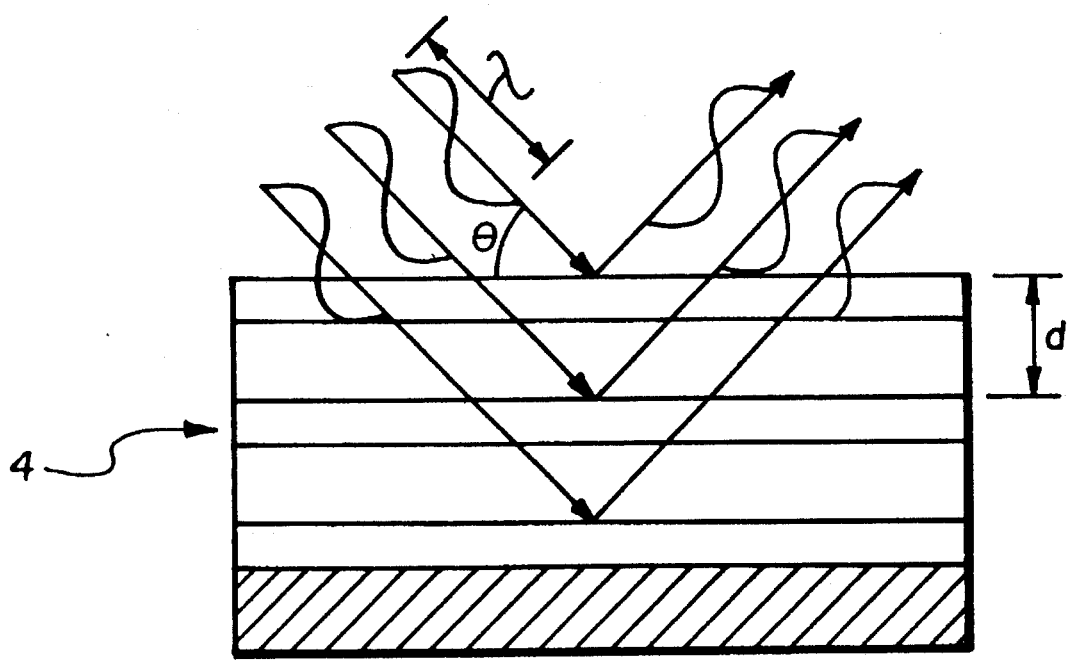
FIG. 1 shows side, cross-sectional views of two multilayer structures, one of which serves as a good x-ray reflector and the other of which is a poor x-ray reflector.
Figure 1:
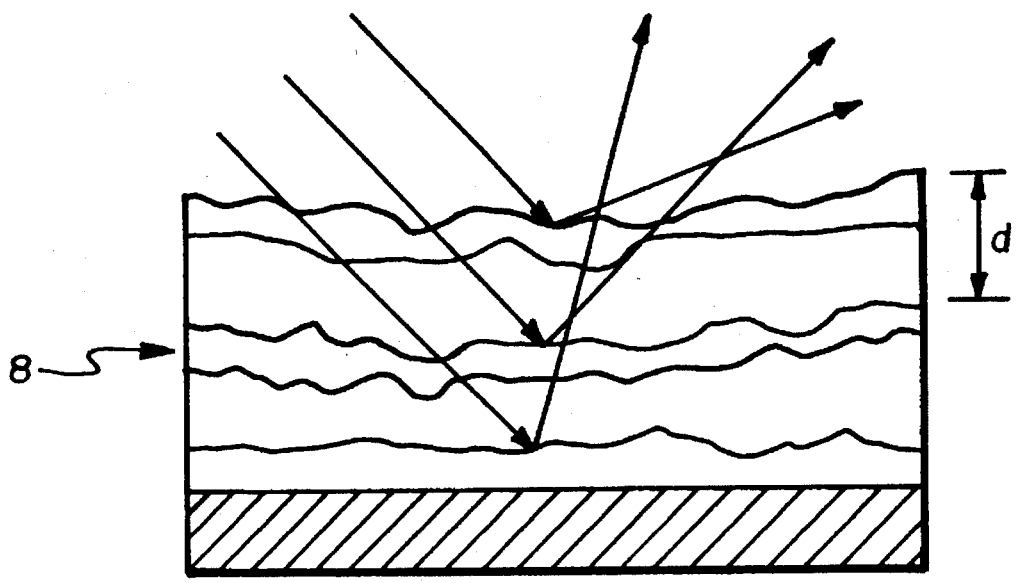
Figure 2:
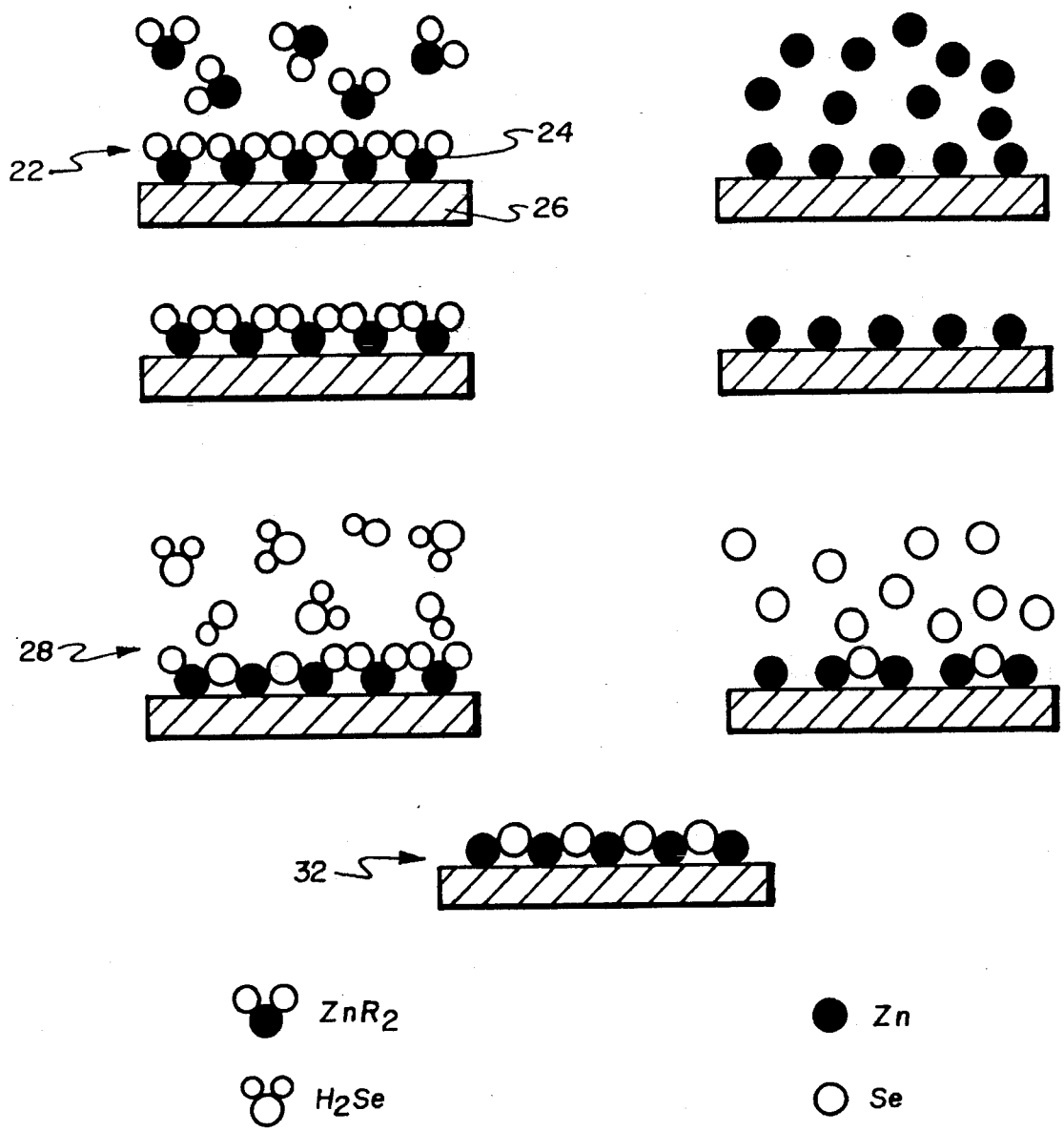
FIG. 2 graphically illustrates the steps in forming one layer of a multilayer structure using chemical vapor deposition atomic layer epitaxy, on the lefthand side, and molecular beam atomic layer epitaxy, on the righthand side.

FIG. 2 shows diagrammatically the steps in atomic layer epitaxy with chemical vapor deposition shown on the lefthand side and molecular beam epitaxy shown on the righthand side. The layer of material deposited is zinc selenide and in the chemical vapor deposition process of ALE, the beginning materials from which the layers are formed are a volatile zinc alkyl compound such as diethyl zinc and a volatile selenide such as selenium hydride, both of which are depicted in FIG. 2. As also depicted in FIG. 2 at 22, a monolayer of diethyl zinc 24 is deposited on a substrate 26. Further exposure of the substrate 26 and layer 24 to a vapor of selenium hydride, depicted at 28, at the appropriate temperature (between 300 and 500 degrees centigrade) results in the ethyl radicals being replaced by selenium atoms (and the giving off of ethane) yields the monolayer of zinc selenide depicted at 32. This could also be achieved using molecular beam epitaxy depicted on the righthand side of FIG. 2, but such process will not be discussed here.

FIG. 3 depicts the steps in the well-known physical and chemical processes that occur in ALE. In these processes, a substrate is exposed to a metal-organic vapor A(g) that contains one of the elements desired in the layer (say the cation). A monolayer of this material is physically adsorbed on the solid surface. A(ad) refers to adsorbed molecules which migrate over the surface until they reach reactive sites and form chemical bonds to the substrate and to each other (step #1). These bonded molecules, A (s), form one and only one (crystalline solid monolayer. However additional molecules may be physically adsorbed on top of this monolayer.

In step #2, the excess A(ad) molecules are removed by decreasing the vapor pressure of A(g). These molecules are pumped out of the reactor.

In step #3, the reactive gas (B(g) is-admitted to the reactor and is adsorbed on the monolayer of A(s) molecules. A chemical reaction occurs in step #4 which removes the organic part of the A(s) molecules, leaving the solid elemental monolayer C(s) and gaseous reaction products D(g) (which are pumped out of the reactor). The multilayer is now ready for a similar process with a gas containing the anion and an appropriate reactive gas.

Interfaces between layers made by ALE are atomically abrupt. Therefore, as electromagnetic radiation crosses the interfaces, it experiences a change in refractive index over a distance that is short compared to the layer thicknesses. This improves optical performance, particularly the intensity of high order diffraction.

FIG. 4, which was earlier briefly described, shows a cross section of alternate layers of zinc selenide and cadmium sulphide, with the different atoms of the elements shown at the bottom of the figure. The representation of FIG. 4 is of a typical multilayer structure which can be formed using ALE, showing the position of the atoms of the different materials of which the layers are composed. The topmost group of layers 52 consist of 2 ½ layers of the compound zinc selenide, with the half layer consisting only of zinc atoms. The middle group 54 consists of 3 ½ layers of the compound cadmium sulfide, with the half layer consisting only of sulfur atoms. The bottommost group of layers 56 again comprises 2½ layers of zinc selenide deposited directly on a substrate 58.

The multilayer structure of FIG. 4 would be fabricated at a tenperature of between 300 and 400 degrees centigrade. The substrate 58 might illustratively be crystalline germanium, sodium chloride, silicon, gallium arsenide, cadmium telluride, lithium fluoride, or mica. Such crystalline materials provide smooth beginning deposition surface areas on which to form the layers of material.

Figure 5:
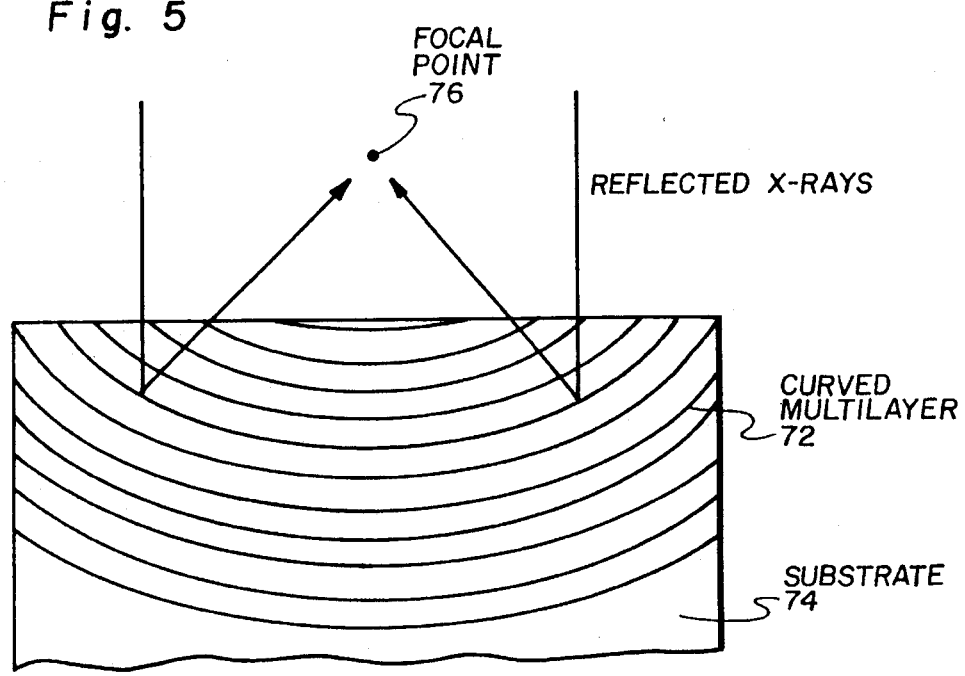
FIG. 5 is a diagrammatical side cross-sectional view of a multilayer device having curved layers for focusing incident x-rays.

FIGS. 5, 6, 7, 8, 9 and 10 all show various implementations of x-ray wave diffraction structures made in accordance with the present invention. FIG. 5 is a graphic representation of a side cross-sectional view of an x-ray diffraction instrument having a plurality of curved (concavely) multilayers 72 formed on the curved (concavely) upper surface of a substrate 74. The multilayer curvature is selected to reflect parallel incoming x-rays toward a focal point 76 to enable using the instrument as an x-ray focusing device. To focus incident x-rays to a point 76 would, of course, require spherical curvature whereas if the curvature were cylindrical, the incident x-rays would be focused along a line. The representation of FIG. 5 is either of spherical curvature or cylindrical curvature to illustrate the focusing of x-rays.

Figure 6:
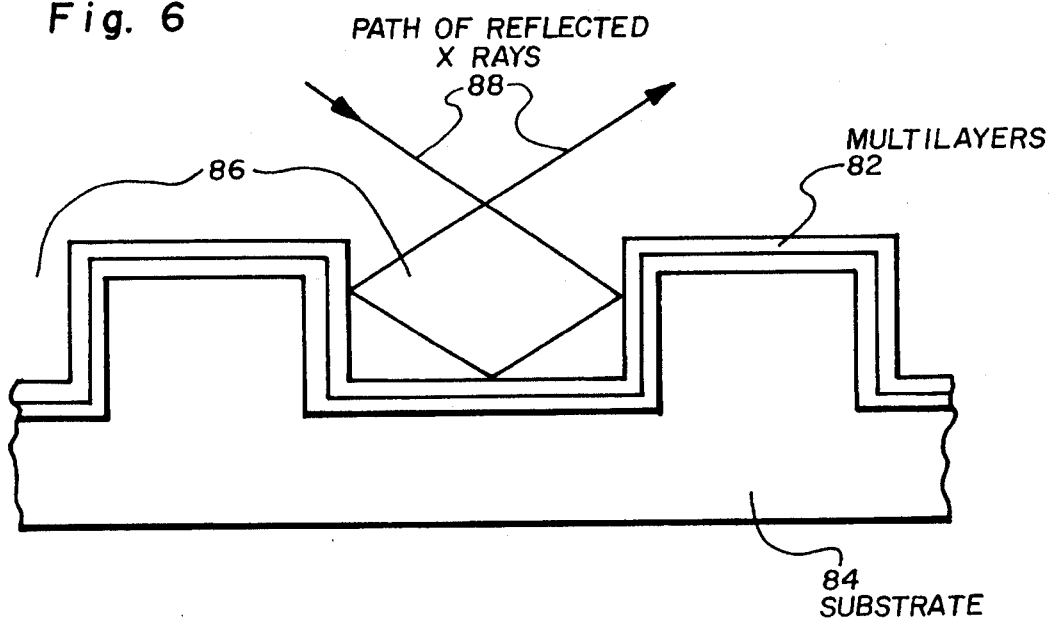
FIG. 6 is a diagrammatical side cross-sectional view of a grating having grooves with rectangular-shaped cross-sections and coated with multilayers in accordance with the principles of the present invention.

FIG. 6 is a representation of a cross-sectional view of a rectangular-groove grating formed in a substrate 84 and coated with multiple pairs of layers 82 using atomic layer epitaxy. The upper surface of the substrate 84 is formed with grooves 86, where such grooves have rectangular cross-sections. The side walls and bottom wall of each groove is coated with the layers of material as shown to enable reflection of x-rays in various directions, one of which is illustrated by path 88 of FIG. 6. As illustrated, there are three reflections in path 88 and this narrows the band of wavelengths that are reflected in accordance with a well known successive reflection principle. Narrowing of the band width serves to provide better resolution of the reflected waves.

Figure 7A:
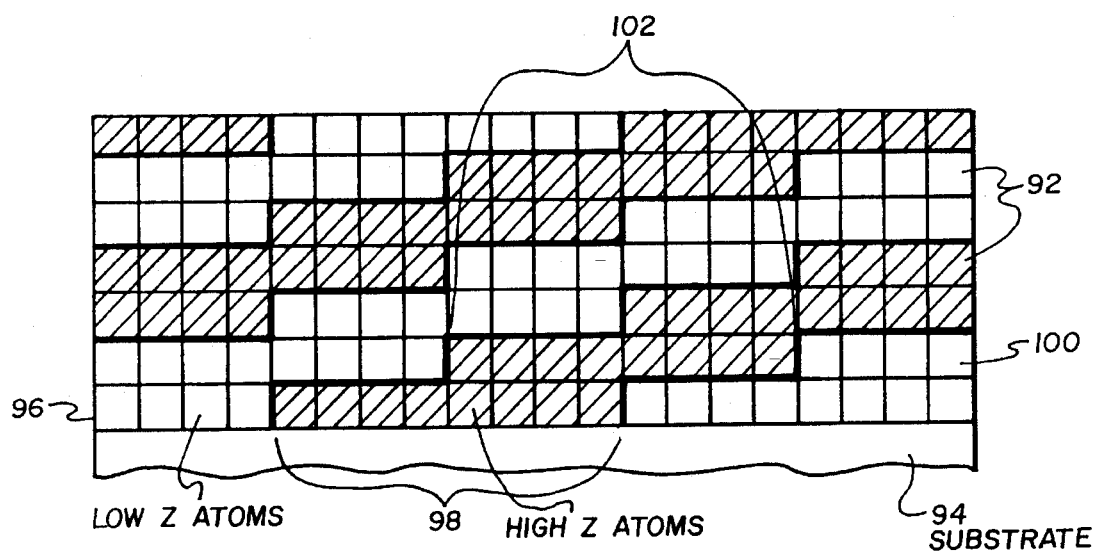
FIGS. 7A and 7B show respectively a diagrammatical side cross-sectional view of multilayer device whose layers are slanted with respect to the substrate surface by using photo-assisted atomic layer epitaxy, and a diagrammatical side cross-sectional view of a device having slanted multilayers illustrating the reflection of x-rays from the layers.

FIG. 7A is a graphic cross-sectional view of a multilayer structure in which the layers 92 are formed on a slant or angle with the surface of a substrate 94 using photo-assisted ALE. Photo-assisted ALE utilizes the phenomenon that certain gases do not deposit on a substrate unless light having certain wavelength bands is used to illuminate the substrate. For example, a mixture of certain gases will deposit two materials on those areas of a substrate illuminated by light, but only one material on those areas not so illuminated. The phenomenon can be utilized to develop layers having various configurations, curvatures, etc.

In the FIG. 7A representation of the slanted layers, the layers would be deposited on the substrate 94 as light is moved to the right as successive layers are deposited. For example, for the first layer 96, light would illuminate the area designated by 98 so that material having a high atomic number would be deposited on that area and material having a low atomic number would be deposited on the remaining areas. For the next layer 100, light would illuminate the area designated as 102 and the shaded material would be deposited on that area, whereas the unshaded material would be deposited on the remaining areas, etc. In this manner, slanted layers of material are formed on the substrate 94 (the squares in FIG. 7A represent lattice sites of atoms of the layers.)

Figure 7B:
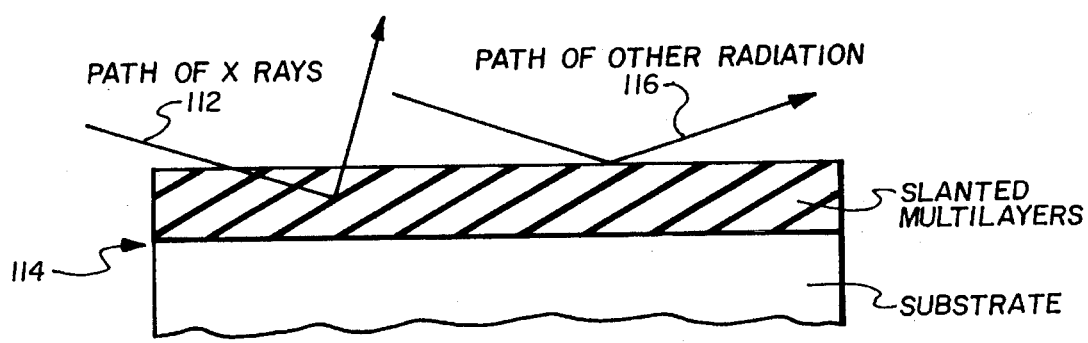

FIG. 7B depicts the path of x-rays 112 reflected from a slanted multilayer structure 114. Path 116 of other radiation traveling in parallel with the x-ray waves, but reflected from the structure 114 in a different direction, is also shown. As can be seen from FIG. 7B, the structure 114 serves to separate reflected x-rays from specularly reflected radiation that does not meet the Bragg conditions of wavelength, for example, visible ultraviolet and infrared radiation. Such structure is useful in the field of solar astronomy where intense visible radiation must not be allowed to strike x-ray detectors and so the visible radiation could be separated from the x-ray waves so that only the x-ray waves would be directed to the x-ray detector.

Photo-assisted ALE can also be used to produce curved layers on generally flat substrates so that initial provision of a substrate having a curved upper surface, as in FIG. 5, would be unnecessary. In such case, the substrate 74 of FIG.

5 could simply have a flat or planar upper surface (which most crystalline substrates would have) and then the deposition of the layers on the substrate could be carried out by photo-assisted ALE to produce curved layers of any desired shape.

Figure 8A:
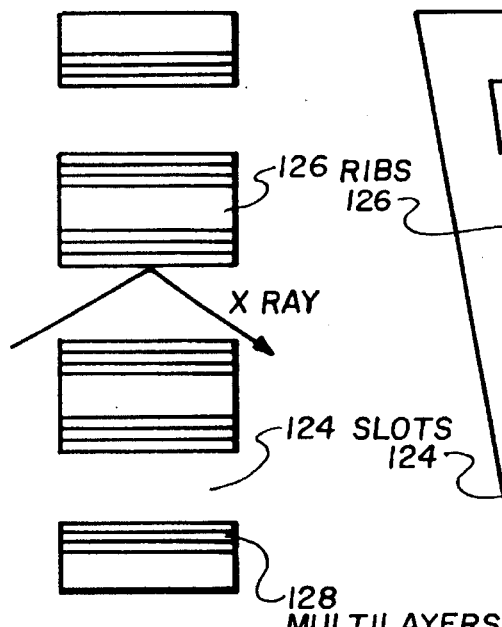
FIGS. 8A, 8B and 8C show respectively a diagrammatical, side cross-sectional view, taken along lines A—A of FIG. 8B, of the construction of a slotted frame coated with multilayers of material in accordance with the present invention, a front, elevational view of the slotted frame, and side cross-sectional views showing the pathway of x-rays impinging on the slotted frames and being reflected therefrom.
Figure 8B:
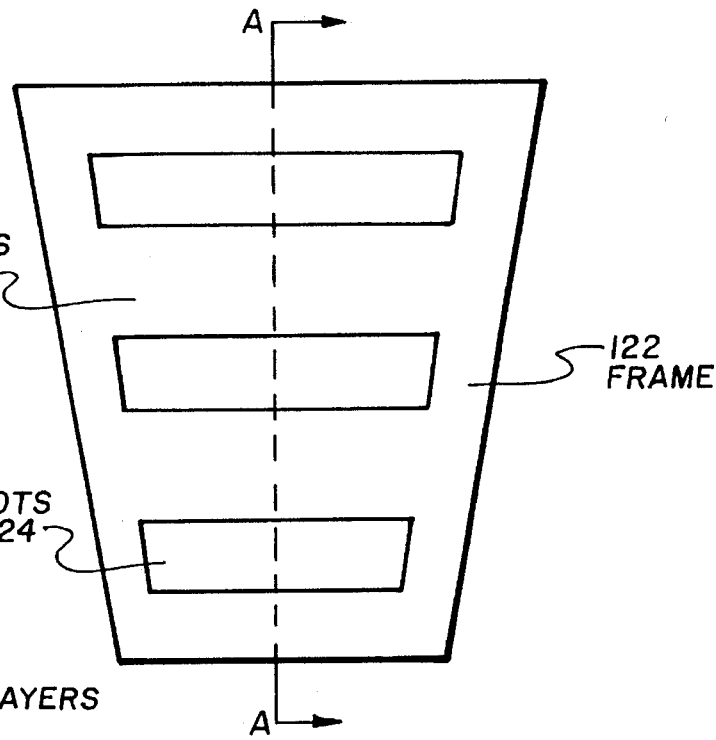
Figure 8C:
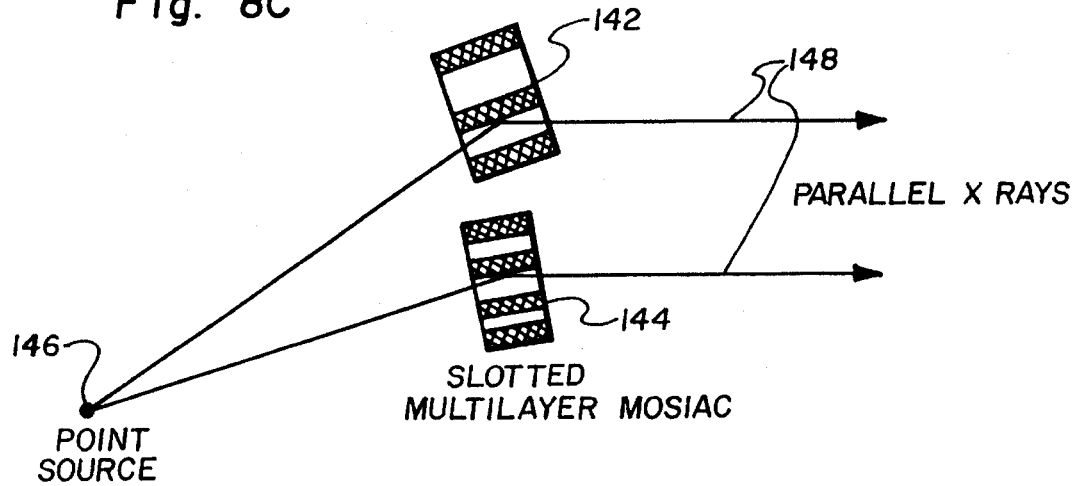

FIGS. 8A, 8B and 8C show the structure and use of slotted frames or mirrors, such as frame 122 of FIG. 8B, having a plurality of ribs 126 separating a plurality of slots 124. FIG. 8A is a cross-sectional view of frame 122 of FIG. 8B taken along lines A—A. FIG. 8C shows the use of a pair of slotted frames 142 and 144 in guiding x-rays emanating from a point source 146 onto generally parallel pathways 148. The frame 122 is formed from a substrate by etching the slots 124 entirely through the substrate, and then depositing multilayers 128 onto the sides of the ribs 126. This type of structure intercepts a large solid angle of the radiation emitted by a source and is therefore an efficient collector (similar to a condenser lens). However, the slotted multilayer mosaic can be thin and light, which is advantageous in applications such as x-ray astronomy from satellites and in x-ray radar.

Figure 9:
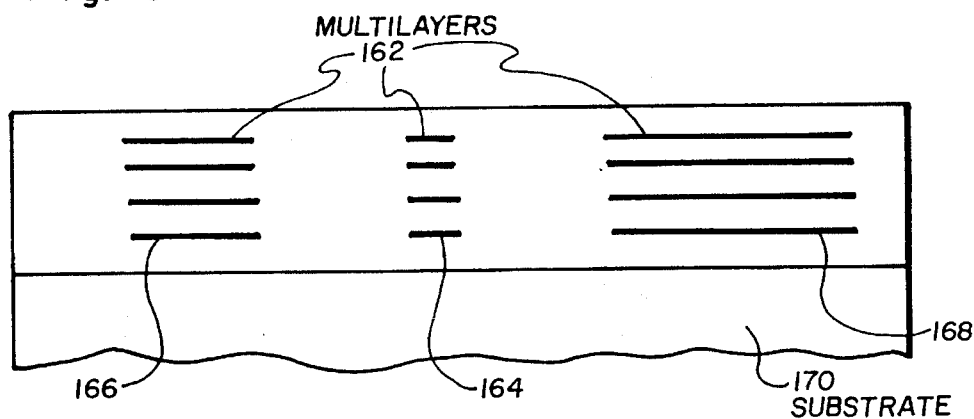
FIG. 9 is a diagrammatical side cross-sectional view of a multilayer, x-ray holograph made in accordance with the principles of the present invention.

FIG. 9 is a graphic representation of a cross-section of an x-ray holograph, having multilayers 162 of spots 164 and stripes 166 and 168 of differing length. The multilayers 162 are formed on the surface of a substrate 170 using photo-assisted ALE, as previously described. In the construction of the x-ray holograph, the locations of the spots 164 and stripes 166 and 168 would be designated by illuminating those areas with light as the deposition of material proceeded. Then, two material layers would be developed on the lighted areas of the substrate 170 whereas single material layers would be developed elsewhere. In this fashion, an x-ray holograph having spots, stripes or other shapes may be produced.

X-ray holographs find application in diffracting and monochromatizing electromagnetic radiation in ways that diffraction gratings and etalons cannot match. For example, holographic gratings can be more efficient at reflecting a desired band of wavelengths than can convention optical elements. Holographic gratings can be used to project desired fine-featured patterns on a substrate, an operation that would be of value in x-ray microlithography for the production of integrated circuits.

Figure 10:
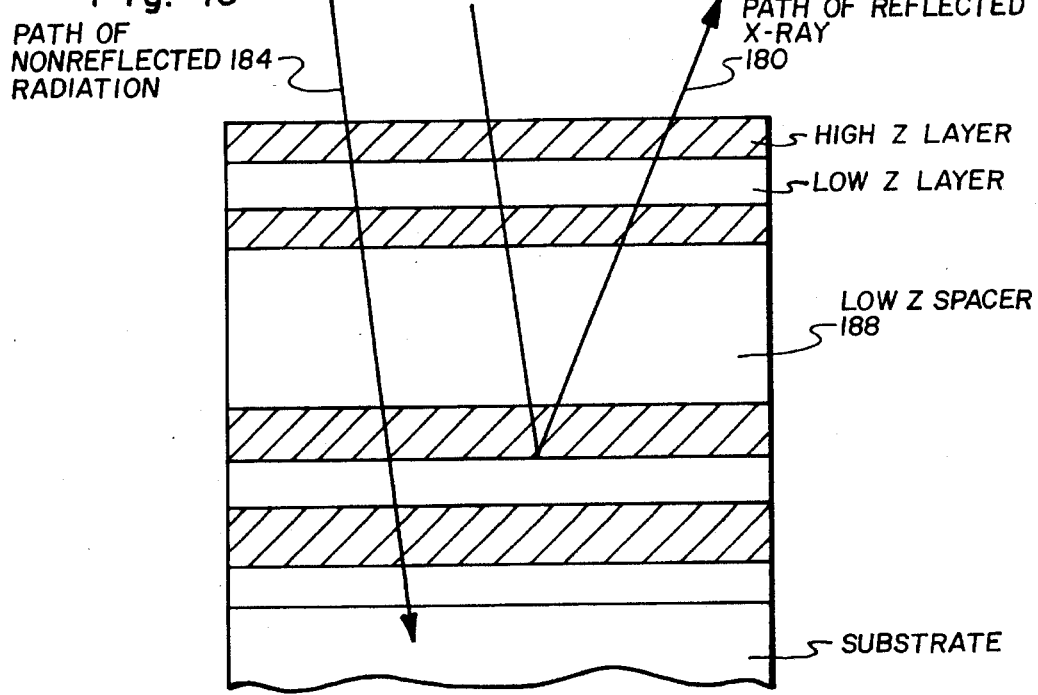
FIG. 10 is a diagrammatical side cross-sectional view of a Fabray-Perot etalon made in accordance with the principles of the present invention and showing pathways of reflected and nonreflected electromagnetic waves.

FIG. 10 shows a graphic side cross-sectional view of a multilayer Fabray-Perot etalon. With this device, one wavelength, represented by path 180, is reflected strongly whereas all other wavelengths are transmitted or absorbed. The thickness of a spacer layer 188, made of a material having a low atomic number, determines the wavelengths which will be reflected.

Constructing a Fabray-Perot etalon as shown in FIG. 10 using ALE allows for precise control of the thickness of the spacer layer 188 and thus precise control of which wavelengths will be reflected.

Figure 11:
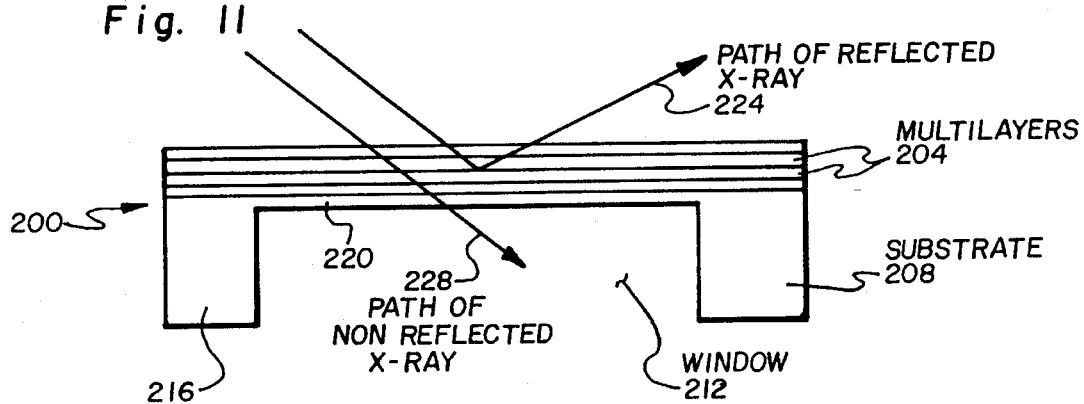
FIG. 11 is a diagrammatical side cross-sectional view of a multilayer beam splitter made in accordance with the principles of the present invention and showing pathways of an electromagnetic wave split into two waves.

FIG. 11 shows a diagrammatic side cross-sectional view of an x-ray beam splitter 200 in which multilayers 204 are deposited on the upper surface of a substrate 208. A portion of the substrate 204 is etched away leaving a window 212 surrounded by a frame 216 (the frame would completely surround the window 212). Such etching of the window 212 would take place after deposition of the multilayers 204. A thin portion 220 of the substrate could be left for additional support of the multilayers 204 provided that x-rays could be readily transmitted therethrough.

As indicated in FIG. 11, some portion of an incident x-ray wave is reflected (indicated by path 224) and some portion is not reflected (indicated by path 228) but rather travels through the multilayers 204 and through the window 212. With ALE, the number and thicknesses of the multilayers 204 can be precisely determined to thus determine the portion of incident x-rays which is to be reflected and the portion which is to be transmitted through the window 212.

In order to achieve high reflectance in a multilayer x-ray diffraction structure, at least one of the component elements in the multilayers should have a high atomic number Z, and at least one should have a low atomic number. An example of a highly reflective multilayer structure is one in which lead telluride and aluminum nitride make up the layer pairs. Such multilayer structure is fabricated at temperatures between 300 and 600 degree centigrade and preferably between 400 and 500 degree centigrade using the following gases: a volatile lead compound, preferably tetraethyl lead; hydrogen; a volatile tellurium compound such as diethyl tellurium or tellurium hydride; aluminum trialkyl compounds especially trimethyl aluminum; and ammonia or hydrazine.

To achieve high resolution, all of the elements of a multilayer x-ray diffraction device should have low atomic numbers Z, or more precisely low absorption over a given wavelength range. An example of such a structure for the nitrogen K-line wavelength range is one composed of zinc selenide and cadmium sulfide layer pavis, which was briefly described earlier. Such a structure is suitable for diffracting x-rays having a wavelength of about ten angstroms, at an angle near 30 degrees. The multilayer structure is made by forming alternate monolayers of each compound on a smooth, single-crystal, preferably germanium substrate maintained at 350±5° centigrade. At a pressure of 10 Torr, the feed gases (diethyl zinc and selenium hydride as one pair, and diethyl cadmium and hydrogen sulfide as the other pair) are alternated every 30 seconds with argon purge gas. More than 100 layer pairs should be laid down to achieve maximum reflectance and resolution.

Single elements such as silicon (as opposed to compounds) can also be deposited by ALE to produce devices which achieve high resolution. Two other multilayer x-ray diffraction structures for achieving high resolution are a silicon and boron nitride layer construction and a carbon and boron nitride layer construction.

Gallium arsenide and zinc are preferred materials for use in photo-assisted ALE since the materials are well suited for use in X-ray holograph, slanted multilayer and curved multilayer devices. If the photo-assisted layer is zinc, then preferably diethyl zinc gas vapor is selected for the fabrication process. Temperature is not a factor in photo-assisted ALE and so it can be selected and adjusted for the other material in the layer pairs, for example, cadmium sulfide at 450 degrees centigrade. In this example, the temperature should not be greater than 500 degrees centigrade since at that temperature diethyl zinc decomposes.

In the manner described, precisely constructed x-ray wave diffraction instruments can be fabricated using atomic layer epitaxy. The ALE produces crystalline layers having no or very little lateral variation in thickness and few, if any, grain boundaries and defects. The deposition of the layers can be controlled to be almost any desired thickness and as thin as one or two angstroms. Such precisely constructed devices yield excellent x-ray handling capabilities of use in a variety of fields.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A method of constructing a narrow band, highly reflective x-ray wave diffraction structure comprising the steps of (a) providing a substrate having a surface area, and (b) growing by atomic layer epitaxy a first layer of material on the substrate, the first layer of material having a first index of refraction and a first thickness, (c) growing by atomic layer epitaxy a second layer of material on top of the first layer of material, the second layer having a second thickness and a second index of refraction which is different than the index of refraction of the material of the first layer and (d) forming a plurality of pairs of first layers and second layers by atomic layer epitaxy with each of the second layers being grown on the first layers such that the combined thickness of each pair of layers formed by the first and second layers is about twelve angstroms or less and the thickness of all the first layers each being substantially the same as that of the corresponding layer of every other pair and the thickness of all the second layers each being substantially the same as that of the corresponding layer of every other pair and the first or second indices of refraction being a high index of refraction with the other of the first or second indices of refraction being a low index of refraction such that every other layer has a high indices of refraction and the interspersed layers have a low indices of refraction and such that x-ray waves impinging thereon are reflected.

2. A method as in claim 1 wherein step (b) further comprises forming one layer of each pair out of zinc selenide and the other layer of each pair out of cadmium sulfide.

3. A method as in claim 2 wherein step (b) further comprise forming the zinc selenide layers to a thickness of about 6 angstroms, and forming the cadmium sulfide layers to a thickness of about 6 angstroms.

4. A method as in claim 1 wherein step (b) further comprises forming one layer of each pair out of a constituent elements having a relatively high atomic number Z, and the other layer of each pair out of a constituent elements having a relatively low atomic number Z.

5. A method as in claim 4 wherein step (b) further comprises forming one layer of each pair out of lead telluride and the other layer of each pair out of aluminum nitride.

6. A method as in claim 1 wherein step (b) further comprises forming the layers of each pair out of constituent elements having low atomic number Z.

7. A method as in claim 6 wherein step (b) further comprises forming one layer of each pair out of aluminum nitride and the other layer of each pair out of zinc sulfide.

8. A method as in claim 1 wherein step (a) further comprises providing a substrate made of material selected from the group consisting of crystalline germanium, crystalline sodium chloride, crystalline silicon, mica, crystalline gallium arsenide, crystalline cadmium telluride and cleared crystalline lithium fluoride.

9. A method as in claim 1 wherein step (a) further comprises providing a substrate formed with at least one surface area comprised of a series of grooves having generally rectangular cross-sections, and wherein step (b) comprises forming layer pairs of substantially uniform thickness on the side walls and bottom walls of the grooves.

10. A method as in claim 1 wherein step (a) further comprises providing a substrate formed with at least one surface area which presents a concave curved surface, and wherein step (b) comprises forming layer pairs of substantially uniform thickness on the curved surface of the substrate.

11. A method as in claim 10 wherein step (a) further comprises providing a substrate formed with a surface area curved to reflect generally in parallel away from surface area x-ray waves received from a point source.

12. A method as in claim 10 Wherein step (a) further comprises providing a substrate formed with a surface area curved to focus generally toward a point, parallel x-ray waves impinging on the surface area.

13. A method as in claim 1 wherein step (b) further comprises forming the layer pairs by photo-assisted atomic layer epitaxy generally at an angle with respect to the substrate surface area.

14. A method as in claim 1 wherein step (a) further comprises providing a substrate formed with slots extending through the substrate from one side to the other, and wherein step (b) comprises forming layer pairs of substantially uniform thickness on the side walls of the slots.

15. A method as in claim 1 further comprising removing substantially all of the substrate underlying a portion of the layer pairs to form a window in the substrate through which a part of any x-ray waves impinging on said portion of the layer pairs may pass, with the remaining part of the x-ray waves so impinging on said portion being reflected from the layer pairs.

16. A method as in claim 1 wherein step (b) further comprises forming layer pairs by photo-assisted atomic layer epitaxy at selected spots and/or lines on the substrate to thereby produce a reflective x-ray holograph.

17. A method as in claim 1 wherein step (b) further comprises forming the layer pairs of one material having a relatively high atomic number Z and one material having a relatively low atomic number Z, where the layer of material having a low atomic number of a selected layer pair is thicker than all other layers.

18. A structure constructed in accordance with the method of claim 1.

19. A structure constructed in accordance with the method claim 5.

20. A structure constructed in accordance with the method of claim 6.

21. A structure constructed in accordance with the method of claim 7.

22. A structure constructed in accordance with the method of claim 9.

23. A structure constructed in accordance with the method of claim 10.

24. A structure constructed in accordance with the method of claim 13.

25. A structure constructed in accordance with the method of claim 14.

26. A structure constructed in accordance with the method of claim 15.

27. A structure constructed in accordance with the method of claim 10.

28. A structure constructed in accordance with the method of claim 17.

29. An x-ray wave diffraction apparatus comprising a substrate having a surface area, and a first layer of material on the substrate, the first layer of material having a first index of refraction and a first thickness, a second layer of material on top of the first layer of material, the second layer of material having a second thickness and a second index of refraction, and a plurality of pairs of the first layers and the second layers with each of the second layers being grown by atomic layer epitaxy on each of the first layers such that the combined thickness of each pair of the first and second layers is about twelve angstroms or less and the thickness of all the first layers of each pair of layers is substantially the same as the thickness of each corresponding layer of every other pair and the thickness of all the second layers of each pair of layers is substantially the same as the thickness of each corresponding layer of every other pair and one of the first or second indices of refraction being a high index of refraction with the other of the first or second indices of refraction being a low index of refraction such that each pair of adjacent layers alternates between a layer with a high index or refraction and a layer with a low index of refraction such that x-rays impinging thereon are reflected.

30. Apparatus as in claim 29 wherein the thickness of one layer of each pair is different from the thickness of the other layer of said each pair.

31. A method of constructing a narrow band, highly reflective x-ray diffraction structure comprising the steps of (a) providing a substrate having a surface area, and (b) growing a first layer of material by atomic layer epitaxy, the first layer of material having a first index of refraction and a first thickness, (c) growing a second layer of material by atomic layer epitaxy, the second layer of material having a second thickness and a second refraction index which is different from the first refractive index, (d) repeating steps b and c to form multiple pairs of first layers and second layers with each second layer being grown on the first layers such that the combined thickness of each pair of layers formed by the first and second layers is 12 angstroms or less and the thickness of all first layers being substantially the same as that of the corresponding layer of every other pair and the thickness of all of the second layers each being substantially the same as that of the corresponding layer of every other pair and one of the first or second indices of refraction being a high index of refraction and the other of the first or second indices being a low index of refraction such that x-ray waves impinging thereon are reflected.

32. The method according to claim 31, wherein step (d) comprises forming more than 100 pairs of layers.

33. A narrow band x-ray diffraction apparatus comprising a substrate having a surface area, a first layer of material disposed on the substrate by atomic layer epitaxy, the first layer of material comprising a member from the group consisting of lead telluride, aluminum nitride, zinc selenide, cadmium sulfide, silicon, boron nitride, gallium arsenide and carbon, the first layer having a first refraction index and a first thickness, a second layer of material disposed on the substrate by atomic layer epitaxy, the second layer of material comprising a member from the group consisting of lead telluride, aluminum nitride, zinc selenide, cadmium sulfide, silicon, boron nitride, gallium arsenide and carbon, the first layer having a second refraction index and a second thickness, a plurality of pairs of the first layers and the second layers with each of the second layers being grown on each of the first layers such that the combined thickness of each pair of the first and second layers is no more than twelve angstroms, and the thickness of all of the first layers of each pair of layers is substantially the same as the thickness of each corresponding layer of every other pair and the thickness of all the second layers of each pair of layers is substantially the same as the thickness of each corresponding layer of every other pair, and one of the first or second indices of refraction being a high index of refraction and the other of the first or second indices being a low index of refraction such that x-ray waves impinging thereon are reflected.

\* \* \* \* \*